US010193274B2

(12) United States Patent
Correll et al.

(10) Patent No.: US 10,193,274 B2
(45) Date of Patent: Jan. 29, 2019

(54) ELECTRONICS MODULE EXTRACTION FEEDBACK SYSTEM

(71) Applicant: PHOENIX CONTACT DEVELOPMENT AND MANUFACTURING, INC., Middletown, PA (US)

(72) Inventors: Michael Anthony Correll, Hershey, PA (US); Scott Michael Frye, Palmyra, PA (US); Talon Coe Kephart, Lancaster, PA (US); Davis Mathews, Lewisberry, PA (US)

(73) Assignee: Phoenix Contact Development and Manufacturing, Inc., Middletown, PA (US)

( * ) Notice: Subject to any disclaimer, the term of this patent is extended or adjusted under 35 U.S.C. 154(b) by 0 days.

(21) Appl. No.: 15/562,639

(22) PCT Filed: Apr. 8, 2016

(86) PCT No.: PCT/US2016/026637
§ 371 (c)(1),
(2) Date: Sep. 28, 2017

(87) PCT Pub. No.: WO2016/164722
PCT Pub. Date: Oct. 13, 2016

(65) Prior Publication Data
US 2018/0115107 A1 Apr. 26, 2018

Related U.S. Application Data

(60) Provisional application No. 62/145,273, filed on Apr. 9, 2015.

(51) Int. Cl.
*H01R 13/629* (2006.01)
*H05K 7/14* (2006.01)

(52) U.S. Cl.
CPC ... *H01R 13/6295* (2013.01); *H01R 13/62944* (2013.01); *H01R 13/62977* (2013.01);
(Continued)

(58) Field of Classification Search
CPC .. H01R 13/6205; H01R 13/639; H01R 24/58; H01R 2107/00; H01R 31/06;
(Continued)

(56) References Cited

U.S. PATENT DOCUMENTS 2,829,477 A    4/1958  Folly
5,589,715 A *  12/1996 Nishitani ............... B60K 37/02
                                                    307/10.1
(Continued)

OTHER PUBLICATIONS

European Patent Office, International Search Report in corresponding PCT/US2016/026637, 13 pages, dated Jul. 15, 2016.
(Continued)

*Primary Examiner* — Truc Nguyen
(74) *Attorney, Agent, or Firm* — Hooker & Habib, P.C.

(57) ABSTRACT

An assembly for attaching and detaching an electronics module from a base includes a feedback assembly that provides an operator with tactile feedback on the relative positioning of the module with the base during attachment or detachment of the module to or from the base. The feedback assembly includes cams on the electronics module and a follower attached to an end of a spring arm on the base. The spring arm forms a portion of a wall that guides movement of the module along the base during attachment or detachment of the module.

23 Claims, 4 Drawing Sheets

(52) U.S. Cl.
CPC ............. *H05K 7/14* (2013.01); *H05K 7/1462* (2013.01); *H05K 7/1474* (2013.01)

(58) Field of Classification Search
CPC .. H01R 13/62; H01R 2201/12; H01R 13/193; H01R 13/641; H01R 13/70; H01R 2103/00; H01R 13/627; H01R 13/6277; H01R 13/62933
See application file for complete search history.

(56) References Cited

U.S. PATENT DOCUMENTS

| | | | |
|---|---|---|---|
| 6,371,435 B1 * | 4/2002 | Landis | H02B 1/052 248/694 |
| 6,452,785 B1 | 9/2002 | Kaaden et al. | |
| 6,478,597 B1 | 11/2002 | Roberts et al. | |
| 6,644,995 B1 | 11/2003 | Jones | |
| 6,669,510 B2 | 12/2003 | Yamawaki et al. | |
| 6,802,737 B2 * | 10/2004 | Bergner | H01R 9/2658 439/532 |
| 6,935,903 B2 * | 8/2005 | Gaidosch | H02B 1/052 439/716 |
| 7,066,677 B2 | 6/2006 | Ruter | |
| 7,491,084 B2 * | 2/2009 | Wedler | H01R 9/03 439/404 |
| 7,597,578 B2 | 10/2009 | Adunka et al. | |
| 7,909,638 B2 | 3/2011 | Seo et al. | |
| 8,576,579 B2 * | 11/2013 | Wang | H02B 1/052 361/652 |
| 8,602,816 B2 | 12/2013 | Donhauser et al. | |
| 2002/0004343 A1 * | 1/2002 | Morikawa | H01R 13/6395 439/716 |
| 2004/0248435 A1 * | 12/2004 | Sato | G01R 1/0466 439/73 |
| 2007/0290778 A1 * | 12/2007 | Stanke | H01R 9/2675 335/202 |
| 2009/0068901 A1 * | 3/2009 | Nad | H01R 9/26 439/716 |
| 2015/0147917 A1 | 5/2015 | Wimmer et al. | |
| 2016/0056599 A1 * | 2/2016 | Peach | H01R 9/2666 439/508 |

OTHER PUBLICATIONS

Japanese Patent Office, Office action and English language translation of office action dated Oct. 17, 2018 in corresponding Japanese Patent Application No. 2017-552952, 7 pages.

* cited by examiner

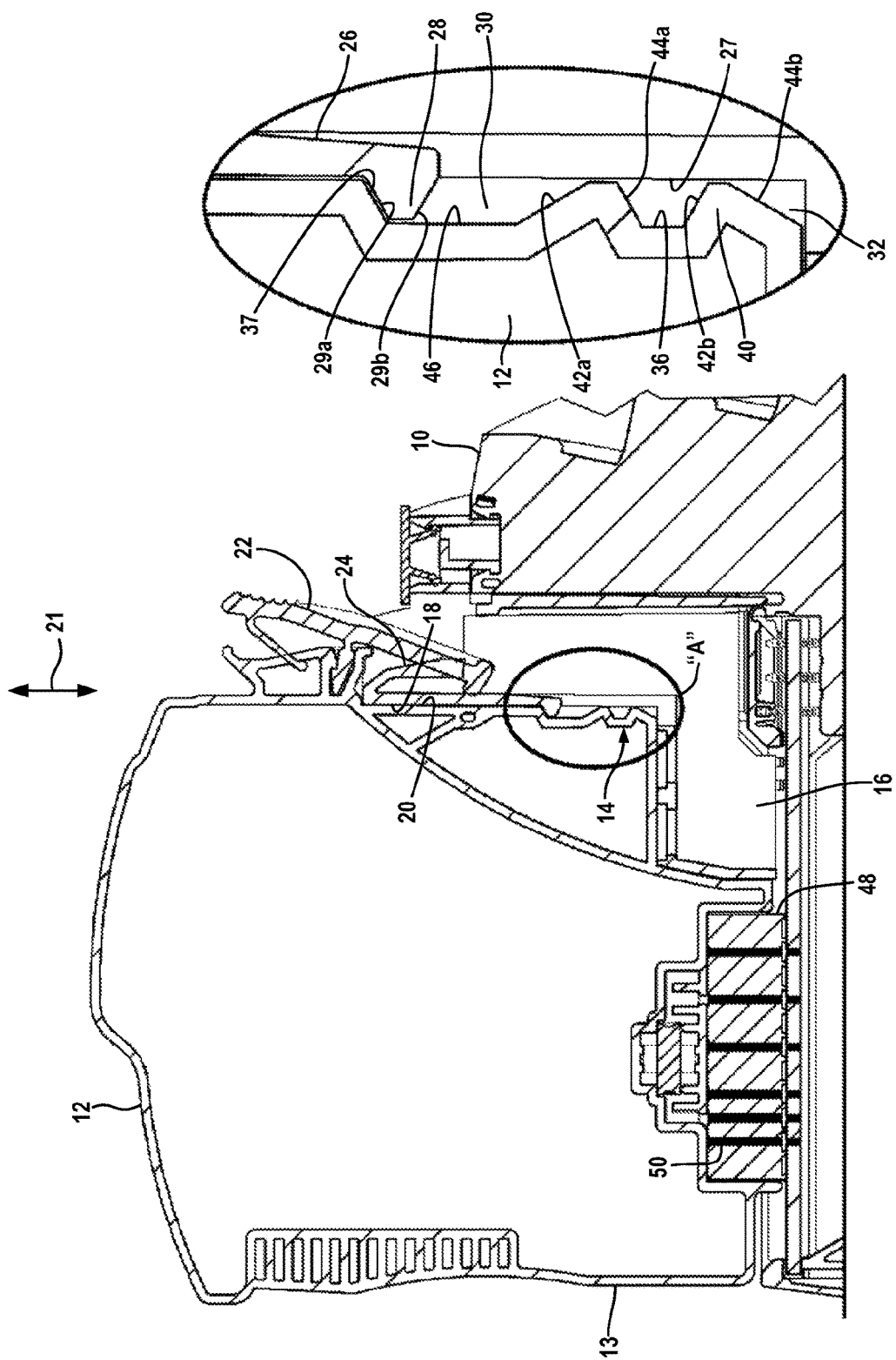

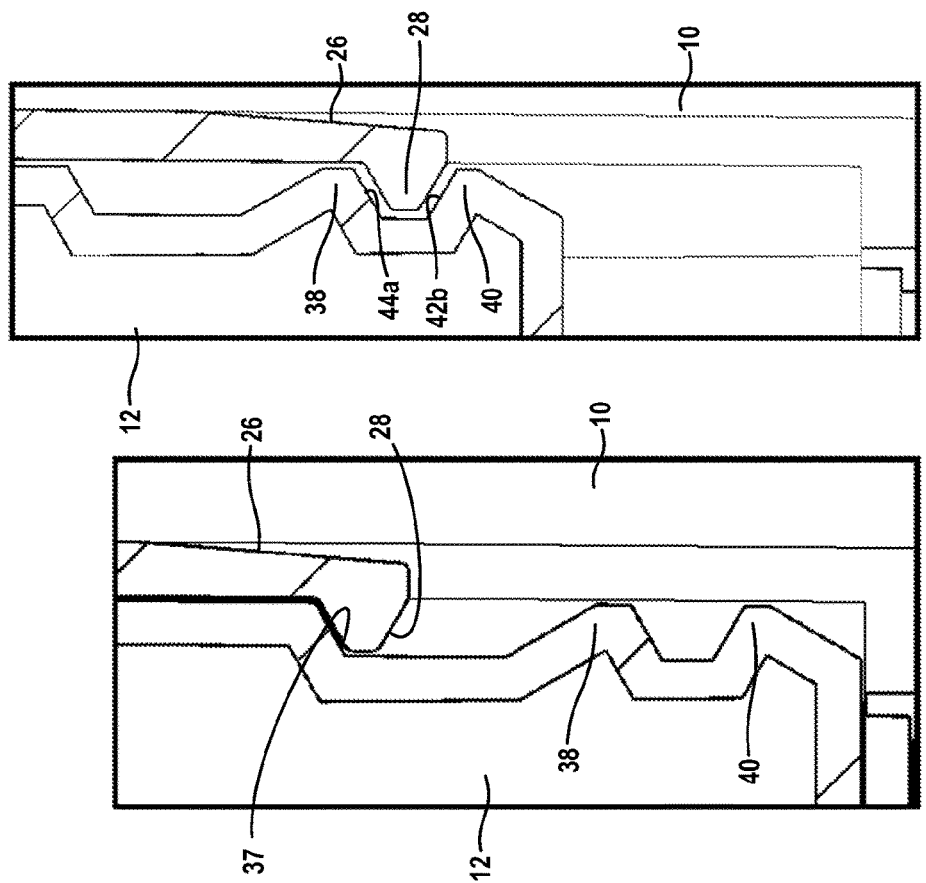

ELECTRONICS MODULE EXTRACTION FEEDBACK SYSTEM

RELATED APPLICATION

This application claims priority to U.S. Provisional Patent Application 62/145,273 entitled "UIO BiModal Extraction Module" filed Apr. 9, 2015 at which priority application is incorporated by reference as if fully set forth herein.

FIELD OF THE DISCLOSURE

This disclosure relates to electronics module systems for attaching and detaching an electronics module from a base, and in particular to an electronics module system in which, when attaching or detaching the module to or from the base, an operator is provided tactile feedback on the state of separation between the module and the base.

BRIEF BACKGROUND OF THE DISCLOSURE

Applicant's data signal input-output system for use with process control systems is disclosed in PCT published application WO2015187687 A1. The input-output system includes a base having a number of electrical connectors for mounting input-output modules to the base. Each input-output module has a matching electrical connector that forms electrical connections with an electric connector of the base.

The base includes a rigid guide wall that assists in attaching or detaching modules to or from the base. Each module includes a rigid housing wall that moves along the guide wall while the module is being attached to or detached from the base.

It is often useful for an operator to temporarily detach a module from the base to electrically disconnect the module from the base for diagnostic purposes. It would be useful to provide an operator detaching the module from the base tactile feedback that informs the operator that the module has electrically disconnected from the base while the module is still against the guide wall. It would also be useful to provide the operator tactile feedback that further movement of the module away from the base will completely separate the module from the base.

BRIEF SUMMARY OF THE DISCLOSURE

Disclosed is a feedback system for use when attaching or detaching a first workpiece or module to or from a second workpiece or base that provides tactile feedback to an operator on the state of separation between the two workpieces.

The disclosed feedback system forms part of an assembly that includes the first workpiece and the second workpiece. Each workpiece includes a rigid wall, the first workpiece wall relatively moveable along the second workpiece wall portion when attaching or detaching the first and second workpieces to or from one another. The walls of the first and second workpieces are configured to cooperatively guide the relative movement of the module with respect to the base during attachment or detachment of the two workpieces. The feedback system includes a spring arm forming a deformable portion of the first workpiece wall, a follower at an end of the spring arm, and first and second spaced-apart cams on the second workpiece wall.

The follower successively moves against the cams while attaching or detaching the two workpieces to or from one another.

Each of the first and second cams are configured to cooperate with the follower to progressively displace the spring arm away from a neutral state of the spring arm as the follower moves against the cam during attachment or detachment of the two workpieces, the displacement of the spring arm thereby generating tactile feedback to the operator of the relative position of the two workpieces with respect to one another during attachment or detachment.

In a first embodiment, the first cam is shaped to deflect the spring arm a first maximum distance away from the neutral state and the second cam is shaped to deflect the spring arm a second maximum distance away from the neutral state, the first maximum distance different from the second maximum distance whereby the level of tactile feedback generated by the first cam is different from the level of tactile feedback generated by the second cam.

In a second embodiment, the cams are disposed in a groove formed in the second workpiece wall. The follower is received in the groove during attachment or detachment of the two workpieces to engage the cams and generate the tactile feedback.

In possible embodiments the tactile feedback generated by the feedback system indicates that the module has become electrically connected to the base or that the module has become electrically disconnected from the base.

Other objects and features of the disclosure will become apparent as the description proceeds and describes one or more illustrative embodiments.

BRIEF DESCRIPTION OF THE DRAWINGS

FIG. 2 is a vertical sectional view taken through the base and a module attached to the base.

FIG. 3 is an enlarged view of highlight "A" of FIG. 2 illustrating a feedback system that provides operator feedback during attachment or detachment of the module to or from the base.

FIG. 4 is similar to FIG. 3 but illustrates the position of the follower in the groove when the module is attached to the base.

FIG. 5 is similar to FIG. 4 but illustrates a detent position of the module relative to the base in which the follower is located between the first and second cams when the module is partially detached from the base.

DETAILED DESCRIPTION

Figure 1:
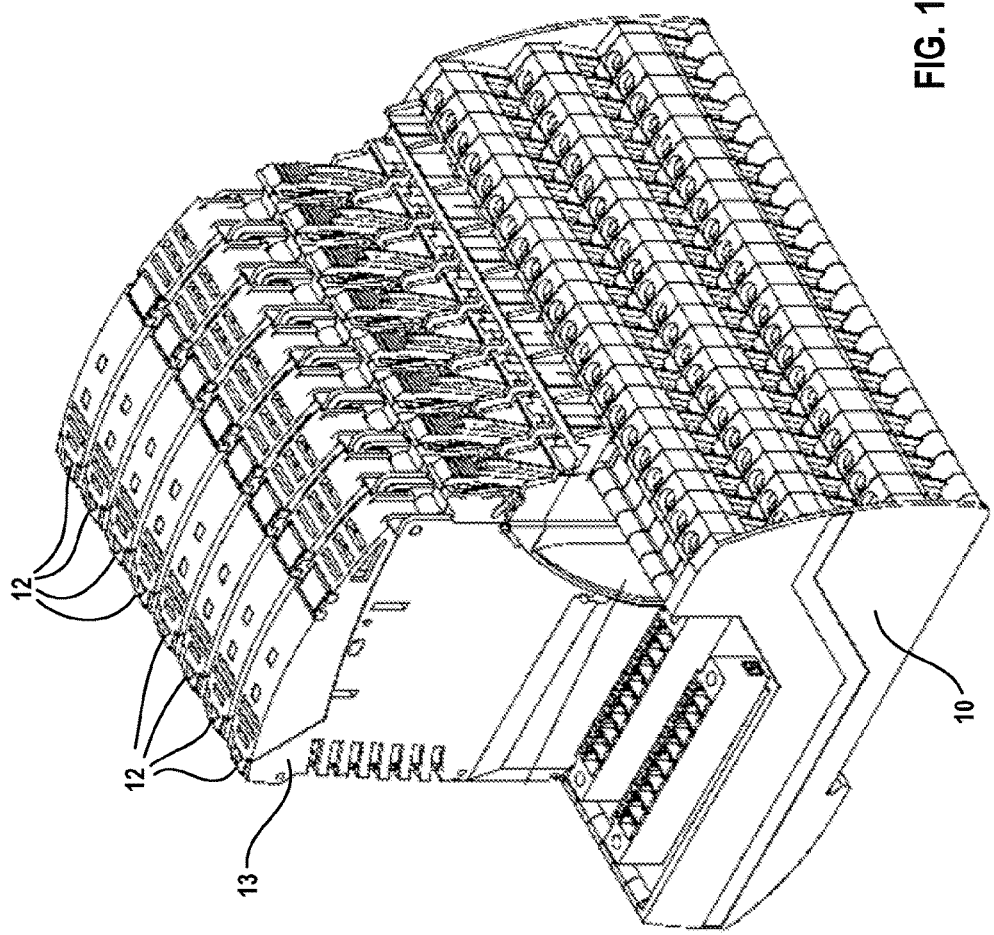
FIG. 1 is a perspective view of a base and a number of electronic modules attached to the base.

FIGS. 1 and 2 illustrate a first workpiece or base 10 that removably mounts a number of second workpieces or modules 12. Each module 12 includes a housing 13 that defines an interior chamber that houses electronic components. The base 10 and each module 12 also cooperatively define a respective feedback system 14 that provides an operator tactile feedback of the relative position of a module 12 with respect to the base 10 during attachment or detachment of the module 12 to or from the base 10.

The base 10 includes a module guide 16 for attaching or detaching modules. The module guide 16 includes a flat, rigid planar wall 18 that cooperates with a rigid housing wall 20 of a module 12 when attaching and detaching a module 12 from the base 10. The housing wall 20 moves relative to a rigid portion of the base wall 18 when attaching or detaching the module 12 to or from the base 10.

The base wall 18 and the module wall 20 are configured to contact one another and cooperatively guide relative movement of the module 12 with respect to the base 10 along a translation axis 21 parallel with the module wall 20 or a plane parallel with the base wall 18 during attachment or detachment of the module 12. During detachment of the module from the base, the module moves with respect to the base 10 in an extraction direction (towards the top of the drawing sheet as viewed in FIG. 2) along the axis 21. During attachment of the module to the base, the module moves with respect to the base 10 in an attachment direction (towards the bottom of the drawing sheet as viewed in FIG. 2) along the axis 21.

Each module 12 also carries an elongate latch 22 that is pivotally mounted to the module 12. When the module 12 is attached to the base 10, the latch 22 pivots to a latched position shown in FIG. 2 and engages a stop member or ledge 24 on the base 10 to resist detachment of the module 12 from the base 10.

The feedback system 14 includes structure on both the base 10 and the module 12 that cooperate to generate the operator feedback during attachment or detachment of the module 12 to or from the base 10. FIGS. 2 and 3 illustrate the feedback system 14.

The feedback system 14 includes a spring arm 26 that is molded as an integral part of the module guide 16. The base wall 18 is formed in part by the same number of like spring arms as the module capacity of the base 10. For example, the illustrated base 10 mounts eight modules 12 and so the base 10 includes eight like spring arms 26. Each spring arm is associated with a respective module 12 attached to the base 10. The portions 27 of the base wall 18 adjacent to the spring arms 26 are rigid wall portions.

A follower 28 is formed at a free end of each spring arm 26. The follower 28 protrudes from the free end of the spring arm and extends towards the module wall 20 during attachment or detachment of the module 12 associated with the spring arm. The follower includes a cam profile having a first profile 29a and a second profile 29b on opposite sides of the follower.

Each profile 29a, 29b is formed as a generally planar surface or ramp that is inclined at an acute angle with respect to the plane of the base wall 18 or the translation axis 21. In the illustrated embodiment the ramps 29a, 29b are each inclined at an angle of about 45 degrees with respect to the translation axis 21.

A groove 30 is formed in the module wall 20 and extends from an open end 32 at the lower end 34 of the module wall 20 to an upper end. The groove 30 is defined by a sidewall 36 extending along an axis parallel with the translation axis during attachment or detachment of the module and parallel with the module wall 20. The sidewall 36 defines a generally flat end wall 37 defining the upper end of the groove 30. The end wall 37 is inclined at an angle of about 45 degrees with respect to the translation axis 21.

A first cam 38 and a second cam 40 spaced away from the first cam extend into the groove 30 from the sidewall 36. Each cam 38, 40 includes a respective cam profile that cams (deflects) the follower 28 during attachment or detachment of the module 12 as will be described in more detail below. The shape of the cam profile defines the displacement of the follower with respect to relative module displacement along the translation axis 21 as is known in cam design. Camming the follower 28 deflects the spring arm 26 away from the neutral state and generates tactile feedback to the operator as will be described in more detail below.

The cam profile of each cam 38, 40 in the illustrated embodiment includes a respective first planar surface or ramp 42 on a first side of the cam and a respective second planar surface or ramp 44 on an opposite, second side of the cam. The reference numbers of the ramps 42, 44 on the first cam 38 have the letter "a" appended to them to indicate they are associated with the first cam 38. The reference numbers of the ramps 42, 44 on the second cam 40 have the letter "b" appended to them to indicate they are associated with the second cam 40.

The ramps 42, 44 are each a generally planar surface that is inclined at an acute angle with respect to the module wall 20 or the translation axis 21. In the illustrated embodiment the ramp 42a is inclined at an angle of about 25 degrees with respect to the translation axis 21. The ramp 44a is inclined at an angle of about 45 degrees with respect to the translation axis 21. The ramp 42b is included at an angle of about 45 degrees with respect to the translation axis 21. The ramp 44b is inclined at an angle of about 25 degrees with respect to the inclination axis 21.

The ramps 42, 44 displace the follower 28 during engagement or disengagement of the module 12 from the base 10 to provide the operator feedback. The slope of each ramp 42, 44 establishes the displacement of the follower with respect to module displacement along the translation axis 21. The maximum height of each ramp 42, 44 above the flat bottom wall 46 of the sidewall 36 establishes the maximum displacement of the follower generated by the ramp.

FIGS. 2 and 3 illustrate a module 12 fully attached and seated on the base 10. The module wall 20 faces a spring arm 26, with the follower 28 of the spring arm received in the groove 30. The follower 28 is located adjacent to the upper end of the groove 30 and spaced from the cams 38, 40. There is a small gap between the follower 28 and the bottom 46 of the groove. The spring arm 26 is in a neutral state, that is, not being cammed by a cam in the groove. In the illustrated embodiment the spring arm 26 is in an unstressed state not subject to beam bending. In other embodiments the spring arm could engage the bottom of the groove and even bend slightly while in the neutral state.

The module latch 22 is in the latched position and has sufficient length to press against the module spring arm 26 and resist deflection of the module spring arm away from the module while the module is latched to the base.

Detachment of the module 12 from the base 10 is described next. Before detaching the module, the module latch 22 is released from the stop 24 to unlatch the module 12 from the base 10. This also moves the latch 22 away from the spring arm 26 so that the latch does not resist camming of the spring arm. The projection 28 is in the groove 30 adjacent the end wall 37 as shown in FIG. 4.

The module 12 is then grasped by an operator and pulled upwardly in the extraction direction to initiate relative movement of the module 12 along the axis 21. The projection remains in the groove 30 with the spring arm 26 in its neutral position until the first ramp 42 of the first cam 38 engages the projection 28. The module wall 18 moves against the base wall 20.

The follower 28 moves up the ramp 42a. The ramp 42a cams the follower 28 away from the groove floor 46 and causes elastic deflection or deformation of the spring arm 26. The ramp 42a progressively deflects the spring arm as the follower moves along the ramp 42a, that is, the deflection of the spring arm from the neutral position increases as the spring arm moves along the ramp. The operator perceives increasing resistance to movement of the module 12 in the extraction direction and is thereby provided tactile feedback on the relative location of the module 12 along the axis 26 and the state of separation of the module 12 with respect to the base 10.

After riding up the first ramp 42a, the follower 28 rides down the second ramp 44a of the first cam 38 and becomes located between the cams 38, 40. See FIG. 5. The spring arm 26 begins returning to its neutral state after the first ramp 42a passes the follower 28. The operator perceives the decrease in resistance to movement of the module 12 as the follower rides down the second ramp 44a in the extraction direction, providing the operator with further tactile feedback on the relative location of the module 12 along the axis 21 and the state of separation of the module 12 with respect to the base 10. The module wall 20 remains against the base wall 18 and has not fully separated from the base wall 18.

The projection 28 remains in the groove 30 with the spring arm 28 in its neutral state until the first ramp 42b of the second cam 40 engages the projection 28 and begins camming the projection 28. The ramp 42b progressively deflects the spring arm as the follower moves along the ramp 42b. The operator perceives increasing resistance to movement of the module 12 in the extraction direction and is thereby provided tactile feedback on the relative location of the module 12 along the axis 26 and the state of separation of the module 12 with respect to the base 10.

After riding up the ramp 42b, the follower 28 rides down the second ramp 44b of the second cam 40. The operator perceives the decrease in resistance to movement of the module in the extraction direction, providing the operator with further tactile feedback on the relative location of the module 12 along the axis 21 and the state of separation of module 12 with respect to the base 10. The module wall 20 is now close to moving beyond the base wall 18.

Continued movement of the module 12 in the extraction direction along the axis 21 causes the projection 28 to exit the bottom end of the groove 30. The module wall 20 moves beyond the base wall 18 and loses contact with the base wall. The module 12 completely separates from the base 10.

The illustrated base 10 includes a number of electrical connector halves 48 (see FIG. 2) that form electrical connections with respective corresponding electrical connector halves 50 carried by the modules 12 when the modules are attached to the base. The electrical connector halves are conventional and carry matching pin and socket connectors for forming electrical connections between connector halves. A first electrical connector half 48 and a second electrical connector half 50 are removably mechanically connectable to each other to make and break the electrical connections between the electrical connector halves. During attachment of a module 12 to the base 10, the base wall 18 and the module wall 20 locate the connector halves in alignment with one another for making the mechanical and electrical connections between the connector halves.

The illustrated feedback system 14 positions the cams 38, along the groove 30 to provide operator feedback during detachment of a module 12 from the base 10 that informs the operator:

(a) that the electrical connector halves 48, 50 have electrically separated and the module 12 is no longer electrically connected to the base 10; and (b) that the module 12 is about to separate and disengage from the base 10.

In addition, the cams 38, 40 of the illustrated feedback system 14 are also capable of cooperating with the follower 28 in holding and maintaining an electrically disconnected module 12 in a detent position with respect to the base 10 when the follower 28 is located between the cams 38, 40 as shown in FIG. 5.

Figure 6:
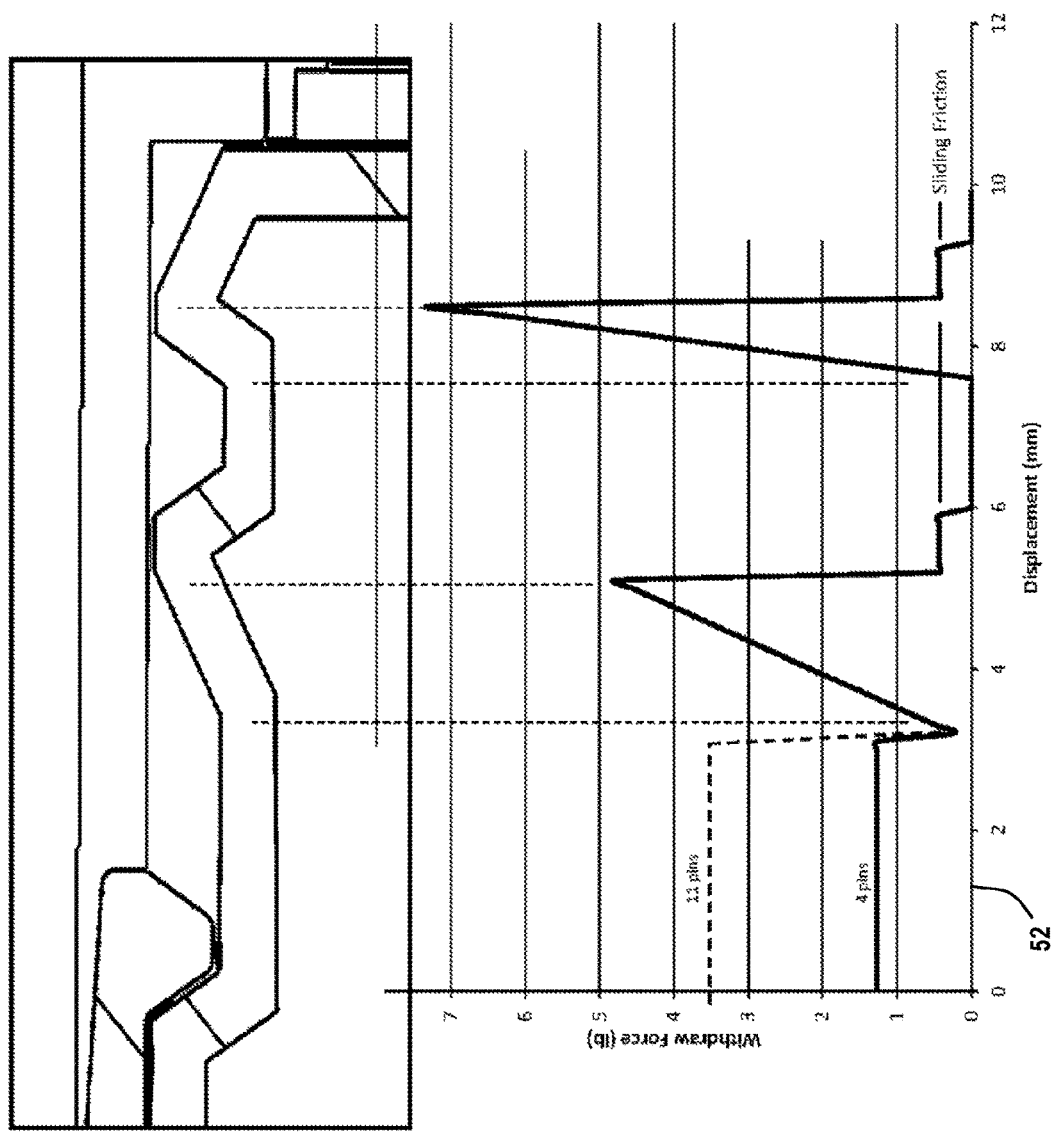
FIG. 6 is a chart of the withdrawal force as a function of module displacement relative to the base when detaching the module from the base.

FIG. 6 is a chart 52 of the typical withdrawal force required to detach a module 12 from the base 10 as a function of module displacement or translation with respect to the base. FIG. 3 is reproduced along the top of the chart 52 and illustrates the relative position of the follower 28 along the groove 30 as a function of module displacement.

Initially the module 12 is attached to the base 10 with the connector halves 48, 50 mechanically and electrically connected to one another. The follower 28 is located adjacent to the upper end of the groove 30 and spaced from the cams 38, 40 as previously described and shown in FIG. 2.

The initial withdrawal force is established by the force required to separate the electrical connector halves 48, 50. Generally the force required to separate the connector halves is a function of the number of pin and socket connections carried by the connector halves. The chart 52 shows the typical withdrawal force for 4-pin connectors and for 11-pin connectors. In the illustrated embodiment about 3.5 millimeters of displacement are required to separate the connector halves.

After the connector halves 48, 50 separate, the required extraction force drops significantly. The follower 28 has not yet reached but is closely spaced from the first cam 38.

Continued displacement of the module 12 causes the follower 28 to engage the first cam and move up the ramp 42a. Because the ramp 42a is inclined at a smaller angle than the ramp 29b of the follower 28, the follower 28 makes essentially line contact with the ramp 29b as the follower moves up the ramp. The withdrawal force increases for the next about 2 mm of displacement as the follower moves up the ramp 42a and peaks at a withdrawal force greater than the force required to disconnect the connector halves.

After the follower 28 moves past the ramp 42a and engages the ramp 44a, the withdrawal force quickly drops as the follower 28 moves down the ramp 44a and then past the first cam 38.

This relatively sudden or steep drop in withdrawal force as the follower 28 moves past the ramp 42a provides feedback to the operator that the electrical connector halves 48, 50 are electrically disconnected from one another. The module housing wall 20 is still against the base wall 18.

The drop in reduction force also signals to the operator that the module 12 has reached a detent position with respect to the base 10. As shown in FIG. 5, the cam follower 28 in the illustrated embodiment is closely received between the first cam 38 and the second cam 40. Relative motion of the module 12 in either the insertion direction or extraction direction relative from the detent position is resisted by the cams 38, 40. Often it is useful to temporarily disconnect electrical connector halves for diagnostic purposes. Maintaining the module 12 in the detent position allows the operator to know the electrical connector halves are disconnected without requiring the module to be completely separated from the base.

Continued displacement of the module 12 in the extraction direction from the detent position shown in FIG. 4 engages the projection ramp 29b against the ramp 42b of the second cam 40. The ramps 29b, 42b are substantially parallel with one another such that the follower ramp 29b makes essentially planar contact with the ramp 42b. The planar contact and the steeper slope of the ramp 42b as compared to the ramp 42a increases the maximum withdrawal force required to move the follower past the second cam 40 as can be seen in the chart 52. This increase in force provides operator feedback that the module 12 is about to fully disengage from the base 10.

Attachment of a module 12 to the base 10 is described next.

During attachment of the module 12 to the base 10, the insertion force applied to the module 12 to move the follower past the second cam 40 and then the first cam 38 essentially mirrors the withdrawal force required to move the follower 28 past the first cam 38 and then the second cam 40. The slope of the ramp 44b is less than the slope of the ramp 42b so that the maximum insertion force required to move the follower 28 past the second cam 40 is less than the corresponding maximum withdrawal force past the cam 40. The slope of the ramp 44a is greater than the slope of the ramp 42a so that the maximum insertion force required to move the follower 28 past the first cam 38 is greater than the corresponding maximum withdrawal force past the first cam 38.

The illustrated embodiment shows use of the feedback system 14 with electronics modules that electrically connect with the base. The feedback system 14 in other embodiments can be used in attaching or detaching a second workpiece to a first workpiece in which tactile feedback to an operator is desired to inform the operator of the state of separation between the workpieces during attachment or detachment of the second workpiece to or from the first workpiece. The first and second workpieces are not required to be electrically connectable to one another.

Furthermore, the feedback system 14 provides tactile user feedback of separation state independently of other feedback mechanisms. The feedback system 14 provides repeatable user feedback regardless of the number of pins and sockets carried by the connector halves 48, 50. The feedback system 14 also provides tactile user feedback even if there were no electrical connectors and other attachment methods are used to attach a module housing 13 to the base 10.

The illustrated module latch 22 is designed to contact the spring arm 26 when the module is latched to the base. Other conventional latch designs could be provided in alternative embodiments that do not interact with or engage components of the feedback system 14.

In different embodiments the camming surfaces of each of the first and second cams 38, 40 are each inclined at an angle of between 15 degrees and 60 degrees to the axis 21 as shown in FIG. 2 to generate tactile feedback without unduly affecting attachment or detachment of a module 12 to or from the base 10.

While this disclosure includes one or more illustrative embodiments described in detail, it is understood that the one or more embodiments are each capable of modification and that the scope of this disclosure is not limited to the precise details set forth herein but include such modifications that would be obvious to a person of ordinary skill in the relevant art and fall within the purview of the following claims.

The invention claimed is:

1. An assembly for attaching and detaching a module to and from a base, the assembly comprising:
    a base, a module removably attachable to the base, and a feedback system;
    the base comprising a rigid wall and the module comprising a housing defining an interior volume of the housing, the housing comprising a rigid outer wall, the housing wall relatively movable against the base wall when attaching and detaching the module to or from the base, the base wall and the housing wall cooperatively guiding said relative movement of the module with respect to the base along a first longitudinal axis;
    the feedback system comprising a spring arm and a groove, the spring arm attached to one of the base wall and the housing wall, the groove in the other of the base wall and the housing wall, the spring arm being elastically deflectable from a neutral state of the spring arm, the spring arm comprising a follower at an end of the spring arm, the groove extending along a second longitudinal axis being parallel with the first axis when the base wall and the housing wall are guiding relative movement of the module with respect to the base, the groove being defined by a sidewall extending along the second axis, first and second spaced-apart cams extending into the groove from the sidewall;
    the follower being received in the groove when the module wall and the base wall are guiding relative movement of the module with respect to the base, the follower moving in an insertion direction with respect to the groove when attaching the module to the base and moving in an extraction direction with respect to the groove when detaching the module from the base;
    the follower successively moving against the first cam and then moving against the second cam when detaching an attached module from the base wherein each cam deflects the spring arm away from the neutral state of the spring arm during detachment of the module from the base;
    the follower successively moving against the second cam and then moving against the first cam when attaching a detached module to the base wherein each cam displaces the spring arm away from the neutral state of the spring arm during attachment of the module to the base;
    whereby deflection of the spring arm during attachment or detachment of the module generates tactile feedback to the operator of the relative position of the module with respect to the base during attachment or detachment of the module to or from the base.

2. The assembly of claim 1 wherein the first cam is shaped to deflect the follower a first maximum deflection and the second cam is shaped to deflect the follower a second maximum deflection different than the first maximum deflection.

3. The assembly of claim 1 wherein each of the first and second cams has a first camming surface on a first side the cam and a second camming surface on a second side of the cam, the first camming surfaces deflecting the spring arm away from the neutral state of the spring arm during detachment of the module from the base, the second camming surfaces engaging deflecting the spring arm away from the neutral state of the spring arm during attachment of the module to the base, the first and second camming surfaces on each cam not being symmetrical with one another.

4. The assembly of claim 3 wherein the first and second camming surfaces of each of the first and second cams are each a planar surface inclined at an acute angle with respect to the second axis.

5. The assembly of claim 4 wherein the first and second camming surface of each of the first and second cams are each inclined at an angle of between 15 degrees and 60 degrees to the second axis.

6. The assembly of claim 4 wherein the first camming surface of the first cam is inclined at a first acute angle to the second axis and the first camming surface of the second cam is inclined at a second acute angle to the second axis, the second acute angle different from the first acute angle.

7. The assembly of claim 4 wherein the second camming surface of the first cam is inclined at a first acute angle to the second axis and the second camming surface of the second cam is inclined at a second acute angle to the second axis, the second acute angle different from the first acute angle.

8. The assembly of claim 1 wherein the spring arm is in the neutral state when the module is fully attached to the base.

9. The assembly of claim 1 wherein the spring arm is in the neutral state when the follower is disposed between the first and second cams during attachment or detachment of the module to or from the module.

10. The assembly of claim 1 wherein the module comprises a first electrical connector half and the base comprises a second electrical connector half, the first and second electrical connector halves being removably connectable to each other to make and break electrical connections between the first and second electrical connector halves, the first and second electrical connector halves not being electrically connected to each when the follower is located between the first and second cams during attachment or detachment of the module to or from the base.

11. The assembly of claim 1 wherein the spring arm is in the neutral position when the follower is disposed between the first and second cams.

12. The assembly of claim 1 wherein the follower is holding the module in a detent position with respect to the base when the follower is between the first and second cams.

13. The assembly of claim 1 further comprising a latch that releasably fastens the base to the module when the base is attached to the module, the latch engaging the spring arm when the latch is fastening the module to the base.

14. An assembly for providing an operator tactile feedback while attaching two workpieces to one another, the assembly comprising:
 a first workpiece, a second workpiece, the first and second workpieces being attachable and detachable with one another, and a feedback device for providing operator feedback of the relative position of the first and second workpieces with respect to one another during attachment of the two workpieces to one another;
 each workpiece comprising a rigid wall, the first workpiece wall relatively moveable along the second workpiece wall when attaching the first workpiece and second workpiece to one another, the walls of the first and second workpieces cooperatively guiding the relative movement of the first workpiece with respect to the second workpiece when attaching the first workpiece and the second workpiece to one another;
 the feedback device comprising a spring arm forming a deformable portion of the first workpiece wall, a follower at an end of the spring arm, and first and second spaced-apart cams on the second workpiece wall;
 the follower successively moving against the first cam and then the second cam while attaching the two workpieces to one another;
 each of the first and second cams cooperating with the follower to progressively displace the spring arm away from a neutral state of the spring arm as the follower moves against each of the first and second cams during attachment of the workpieces to one another, the displacement of the spring arm thereby generating tactile feedback to the operator of the relative position of the two workpieces with respect to one another during attachment of the two workpieces with one another;
 the first cam deflecting the spring arm a first maximum distance away from the neutral state, the second cam deflecting the spring arm a second maximum distance away from the neutral state, the first maximum distance different from the second maximum distance whereby the level of tactile feedback generated by the first cam is different from the level of tactile feedback generated by the second cam.

15. The assembly of claim 14 wherein the spring arm is in the neutral state when the follower is disposed between the first and second cams.

16. The assembly of claim 14 wherein the first and second cams cooperate with the follower to maintain the second workpiece in a detent position with respect to the first workpiece when the follower is between the first and second cams.

17. The assembly of claim 14 wherein the first cam deflects the spring arm at a first rate when deflecting the spring arm from the neutral state to the first maximum distance from the neutral state and the second cam deflects the spring arm at a second rate different from the first rate when deflecting the spring arm from the neutral state to the second maximum distance from the neutral state during attachment of the first workpiece and the second workpiece to one another.

18. The assembly of claim 14 wherein the first workpiece comprises a first electrical connector half and the second workpiece comprises a second electrical connector half, the first and second electrical connector halves being removably mechanically connectable to each other to make and break electrical connections between the first and second electrical connector halves, the first and second electrical connector halves not being electrically connected to each other when the follower is located between the first and second cams during attachment of the two workpieces with one another.

19. An assembly for providing an operator tactile feedback while detaching two workpieces from one another, the assembly comprising:
 a first workpiece, a second workpiece, the first and second workpieces being attachable and detachable with one another, and a feedback device for providing operator feedback of the relative position of the first and second workpieces with respect to one another during detachment of the two workpieces from one another;
 each workpiece comprising a wall, the first workpiece wall relatively moveable along the second workpiece wall when detaching the first workpiece and second workpiece from one another, the walls of the first and second workpieces cooperatively guiding the relative movement of the first workpiece with respect to the second workpiece when detaching the first workpiece and the second workpiece from one another;
 the feedback device comprising a spring arm forming a portion of the first workpiece wall, a follower at an end of the spring arm, and first and second spaced-apart cams on the second workpiece wall;
 the follower successively moving against the first cam and then against the second cam during relative movement of the first workpiece with respect to the second workpiece while detaching the two workpieces from one another;
 each of the first and second cams being configured to cooperate with the follower to progressively displace the spring arm away from a neutral state of the spring arm as the follower moves against each of the first and second cams during detachment of the first and second workpieces from one another, the deflection of the spring arm thereby generating tactile feedback to the operator of the relative position of the two workpieces with respect to one another during detachment of the two workpieces from one another;

the first cam deflecting the spring arm a first maximum distance away from the neutral state, the second cam deflecting the spring arm a second maximum distance away from the neutral state, the first maximum distance different from the second maximum distance whereby the level of tactile feedback generated by the first cam is different from the level of tactile feedback generated by the second cam.

20. The assembly of claim 19 wherein the spring arm is in the neutral state when the follower is disposed between the first and second cams.

21. The assembly of claim 19 wherein the first and second cams cooperate with the follower to maintain the second workpiece in a detent position with respect to the first workpiece when the follower is between the first and second cams.

22. The assembly of claim 19 wherein the first cam deflects the spring arm at a first rate when deflecting the spring arm from the neutral state to the first maximum distance from the neutral state and the second cam deflects the spring arm at a second rate different from the first rate when deflecting the spring arm from the neutral state to the first maximum distance from the neutral state during detachment of the first and second workpieces from one another.

23. The assembly of claim 19 wherein the first workpiece comprises a first electrical connector half and the second workpiece comprises a second electrical connector half, the first and second electrical connector halves being removably mechanically connectable to each other to make and break electrical connections between the first and second electrical connector halves, the first and second electrical connector halves not being electrically connected to each other when the follower is located between the first and second cams during detachment of the first workpiece and the second workpiece from one another.

* * * * *